United States Patent

[11] 3,526,205

[72] Inventor René Rosenheinrich
Ebermannstadt, Germany
[21] Appl. No. 587,713
[22] Filed Oct. 19, 1966
[45] Patented Sept. 1, 1970
[73] Assignee Siemens Aktiengesellschaft
Munich, Germany
a corporation of Germany
[32] Priority Oct. 22, 1965
[33] Germany
[31] S 100,151

[54] PROCESS AND APPARATUS FOR HEAT TREATMENT OF DISC-SHAPED SEMICONDUCTOR BODIES
4 Claims, 3 Drawing Figs.

[52] U.S. Cl. ........ 118/49
[51] Int. Cl. ........ C23c 11/00
[50] Field of Search ........ 211/41; 148/13, 135, 189; 118/48-49.5, 500, 503, 509, 505; 117/106-107.2(Inquired); 263(Inquired); 266(Inquired); 219(Inquired); 17(Inquired)

[56] References Cited

UNITED STATES PATENTS

| | | | |
|---|---|---|---|
| 1,852,543 | 4/1932 | Spencer | 148/13UX |
| 3,226,254 | 12/1965 | Reuschel | 118/49.5X |
| 3,377,216 | 4/1968 | Raithel | 148/189 |
| 3,417,733 | 12/1968 | Makino | 118/49 |

FOREIGN PATENTS

| | | | |
|---|---|---|---|
| 957,170 | 5/1964 | Great Britain | 148/186 |

*Primary Examiner*—Morris Kaplan
*Attorney*—Curt M. Avery, Arthur E. Wilfond, Herbert L. Lerner and Daniel J. Tick

ABSTRACT: In order to prevent the collapse of an evacuable quartz tube containing semiconductor wafers during the heat treatment of said wafers, supporting discs larger than the semiconductor wafers are inserted into the evacuable quartz tube.

PROCESS AND APPARATUS FOR HEAT TREATMENT OF DISC-SHAPED SEMICONDUCTOR BODIES

In semiconductor technology, diffusion methods have been applied, for instance for changing the doping of particular regions of a semiconductor body. Furthermore, by these methods impurities can be introduced into semiconductor bodies for purposes other than doping, for instance for shortening the lifetime of the minority carriers in the semiconductor material, thereby achieving shorter switching times in controlled semiconductor devices, for instance. Diffusion methods, so-called "sealed tube methods," are known whereby semiconductor bodies together with a doping source are inserted in a container. Subsequently, after the evacuating of the container, the doping substance is indiffused by heating. The temperature and length of the diffusion procedure determine the surface concentration of the doping substance and its depth of penetration into the semiconductor bodies. In general, the doping source is adjusted remote from the semiconductor bodies. The doping source may, for instance, consist of a piece of semiconductor material containing small amounts of the doping substance, or of an elemental piece of the doping substance. The doping substance, however, may also be contained in a layer deposited on the semiconductor body. It is advantageous with such diffusion methods, not to process a single semiconductor body, but several semiconductor bodies which are enclosed in a container together with the source of the doping substance. The material of the container has to satisfy strict requirements. No impurities must evaporate from the container into the interior thereof. It must possess a sufficient mechanical stability at the high temperatures which occur in the diffusion process. Quartz glass, for instance, eminently satisfies the first condition and is therefore preferably used as sealed tubes for diffusion processes. At high temperatures, however, the evacuated and heated tube can collapse due to atmospheric pressure because of insufficient thermal stability, whereby the tube wall presses against the semiconductor bodies which are only of about 300$\mu$ thickness and are plastic at the diffusion temperatures and thus become deformed.

The present invention overcomes this disadvantage. More particularly, the invention relates accordingly to an arrangement or holder for the heat treatment of disc-shaped semiconductor bodies in a cylindrical evacuated container, particularly of silicon discs in a quartz tube. According to my invention, the semiconductor bodies are arranged between supporting discs whose dimensions are greater than those of the semiconductor bodies, and which are made of a material of greater thermal stability than that of the container.

The invention and its effects are described in further detail by means of the drawings in which.

Figure 1:
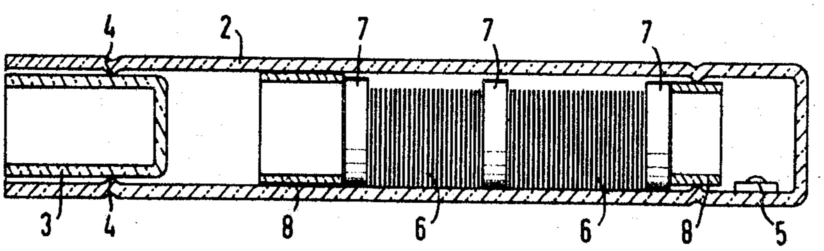
FIG. 1 shows a practical example of the holder of the invention before the diffusion procedure.

FIG. 1 shows a closed tube 2, consisting, for example of quartz. After being evacuated, it is hermetically sealed at one side by a tube 3 which is closed at one side and sealed to the wall of the tube 2 along fusion line 4. In the closed tube, a source 5 of an impurity is provided. This source consists, for example, of an aluminum wafer alloyed into a silicon disc. Furthermore, for instance, two piles or stacks 6 of disc-shaped semiconductor bodies are inserted in the tube 2, between the flat sides of three supporting discs 7. The piles 6 and the supporting discs 7 are laterally fastened, for instance, by two quartz rings 8 which can be fused to the wall of the tube. The semiconductor bodies can also be installed in a stand, for instance a bar consisting of quartz or silicon, and being provided with incisions. In an advantageous embodiment, the supporting discs can therefore consist of the same material as the semiconductor bodies.

Figure 2:
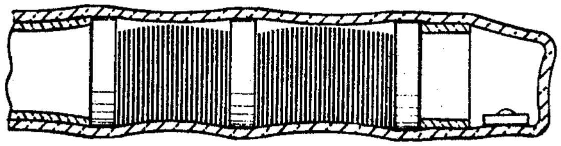
FIG. 2 shows the same holder after the heat treatment.

In a practical example, the semiconductor bodies are silicon discs having a diameter of about 19 mm, and a thickness of 0.3 mm. The supporting discs, which may also consist of silicon, have a thickness of about 3 mm and a diameter of 20 to 21 mm. Their distance between each other is about 20 mm so that about 60 silicon discs can be placed between the flat sides of two supporting discs. The dimensions of this example apply when the quartz tubes have a wall thickness of about 1 mm. If another material, which has a greater stability at elevated temperatures is used, or if the walls are thicker, the distance between the supporting discs may be greater. The tube as depicted in FIG. 1, is placed into the diffusion furnace and, in the case of an aluminum diffusion, can be heated for instance to about 1230°C. When it is taken out of the furnace, after a diffusion time of, for instance 30 hours, it has approximately the shape as depicted in FIG. 2 in a cross section. The evacuated tube being plasticized by the heat, was deformed by atmospheric pressure. The supporting discs, however, have prevented the wall of the tube from pressing against the semiconductor bodies, thereby deforming them.

Figure 3:
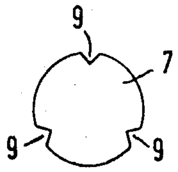
FIG. 3 shows a supporting disc.

It is possible that, because of the deformation due to the heat treatment, the wall of the tube so closely surrounds the supporting discs, especially if the discs have a diameter of more than 25 mm, that a sufficient quantity of doping substance no longer reaches the semiconductor bodies. The supporting discs are therefore provided with recesses. As shown in FIG. 3, recesses 9, starting from the rim, are ground into the supporting discs.

I claim:

1. Means for doping semiconductor wafers by diffusion coating comprising an evacuated and sealed quartz tube; dopant material disposed therein and adapted to be vaporized upon the application of heat by means located external to the tube; at least one stack of said semiconductor wafers disposed in said tube; said wafers comprising a material having a characteristic of heat stability with respect to deformation at the diffusion temperatures whereas said tube is subject to deformation at said diffusion temperatures; a spacer element consisting of the same material as the wafers and disposed at each end of each said stack; each spacer element being of a substantially larger diametric size than said wafers and approximating at least loosely the inner diameter of the tube and related to the extent of stack size whereby at said diffusion temperatures the spacers retain the deforming tube wall out of contact with the wafers; and each spacer element being notched across the edge wall whereby to communicate the vaporizing and wafer supporting areas despite tube deformation at the diffusion temperatures.

2. The apparatus of claim 1, wherein the distance between two supporting discs is 10 to 25 mm.

3. The apparatus of claim 1, wherein the diameter of the supporting discs is 2 to 4 mm larger than the diameter of the semiconductor bodies.

4. The apparatus of claim 3, wherein the supporting discs are at least 2.5 mm thick.